US012368320B2

(12) United States Patent
Endo

(10) Patent No.: US 12,368,320 B2
(45) Date of Patent: Jul. 22, 2025

(54) SYSTEM AND METHOD FOR CONTROLLING A MICROGRID USING AN INTELLIGENT ELECTRONIC DEVICE, AND AN INTELLIGENT ELECTRONIC DEVICE FOR CONTROLLING PROTECTION RELAY IN A MICROGRID

(71) Applicant: Mitsubishi Electric Corporation, Tokyo (JP)

(72) Inventor: Shunsuke Endo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 281 days.

(21) Appl. No.: 17/724,748

(22) Filed: Apr. 20, 2022

(65) Prior Publication Data
US 2023/0163629 A1    May 25, 2023

(30) Foreign Application Priority Data
Nov. 22, 2021    (JP) .................. 2021-189106

(51) Int. Cl.
*H02J 13/00* (2006.01)
*G01R 19/25* (2006.01)
*H02J 3/00* (2006.01)

(52) U.S. Cl.
CPC ...... *H02J 13/0004* (2020.01); *G01R 19/2513* (2013.01); *H02J 3/001* (2020.01); *H02J 2203/10* (2020.01)

(58) Field of Classification Search
CPC ................ H02J 3/388; H02J 13/00001; H02J 13/00004; H02J 13/00006; H02J 13/00032; H02J 13/00036
See application file for complete search history.

(56) References Cited

U.S. PATENT DOCUMENTS

| 4,566,052 A * | 1/1986 | Kammiller | H02M 3/156 361/91.1 |
| 6,160,690 A * | 12/2000 | Matsumoto | H02H 1/0061 361/64 |
| 2002/0036430 A1* | 3/2002 | Welches | F02G 1/043 307/18 |

(Continued)

FOREIGN PATENT DOCUMENTS

| JP | 2009254211 A | 10/2009 |
| JP | 2020526174 A | 8/2020 |

OTHER PUBLICATIONS

Notice of Reasons for Refusal dated Oct. 15, 2024, issued in the corresponding Japanese Patent Application No. 2021-189106, 6 pages including 3 pages of English Translation.

*Primary Examiner* — Nicholas Klicos
(74) *Attorney, Agent, or Firm* — BUCHANAN, INGERSOLL & ROONEY PC

(57) ABSTRACT

A microgrid control system includes: a first intelligent electronic device to detect an open/closed state of a switch coupling a microgrid and a higher-ordered system; a protection relay to disconnect a consumer from the microgrid when detecting a fault current; and a second intelligent electronic device including protection relay-controlling circuitry to apply, to the protection relay, a set value according to at least the open/closed state of the switch, wherein the protection relay detects the fault current using the set value applied by the second intelligent electronic device.

15 Claims, 5 Drawing Sheets

(56) References Cited

U.S. PATENT DOCUMENTS

| | | | |
|---|---|---|---|
| 2013/0015703 A1* | 1/2013 | Rouse | H02J 3/06 |
| | | | 307/18 |
| 2014/0200722 A1* | 7/2014 | Bhavaraju | H02J 13/00002 |
| | | | 700/286 |
| 2018/0316184 A1* | 11/2018 | Hong | H02H 7/262 |
| 2019/0103743 A1 | 4/2019 | Sun et al. | |
| 2019/0109458 A1* | 4/2019 | Yamauchi | H02J 9/06 |
| 2019/0237283 A1* | 8/2019 | Pabst | H02H 1/0069 |
| 2019/0237965 A1 | 8/2019 | Pabst et al. | |
| 2019/0319450 A1* | 10/2019 | Jung | H02J 3/0012 |
| 2020/0244062 A1* | 7/2020 | Inam | H02J 3/1807 |
| 2020/0350761 A1* | 11/2020 | Wang | H02J 3/32 |
| 2020/0389030 A1* | 12/2020 | Porter | H02J 3/1807 |
| 2020/0389048 A1* | 12/2020 | Manson | H02H 3/46 |
| 2022/0014021 A1* | 1/2022 | Saleh | H02H 7/26 |

* cited by examiner

| OPEN/CLOSED STATE | CLOSED STATE | OPEN STATE | | |
|---|---|---|---|---|
| POWER SUPPLY SOURCE | – | X1[kW] | X2[kW] | X3[kW] |
| SET VALUE | A1[A] | A2[A] | A3[A] | A4[A] |

| OPEN/CLOSED STATE | CLOSED STATE | OPEN STATE | | |
|---|---|---|---|---|
| POWER SUPPLY SOURCE | – | X1[kW] | X2[kW] | X3[kW] |
| SET VALUE | B1[A] | B2[A] | B3[A] | B4[A] |

SYSTEM AND METHOD FOR CONTROLLING A MICROGRID USING AN INTELLIGENT ELECTRONIC DEVICE, AND AN INTELLIGENT ELECTRONIC DEVICE FOR CONTROLLING PROTECTION RELAY IN A MICROGRID

BACKGROUND OF THE INVENTION

Field of the Invention

The present disclosure relates to a microgrid control system, a control method of a microgrid, and an intelligent electronic device.

Priority is claimed on Japanese Patent Application No. 2021-189106, filed Nov. 22, 2021, the content of which is incorporated herein by reference.

Description of Related Art

Microgrids, which are small-scale power systems that supply electric power from distributed power supplies to power loads, are attracting attention from the viewpoints of using renewable energy, stable electric power supply, and the like. States in which a microgrid is operated include a grid connection mode in which the microgrid is operated in a state of being connected to a higher-ordered system and an island mode in which the microgrid is operated separately from the higher-ordered system. Published Japanese Translation No. 2020-526174 of the PCT International Publication discloses a synchronization method when a microgrid is mutually connected to a neighboring power transmission system.

SUMMARY OF THE INVENTION

However, in a microgrid, a fault current in the island mode is less than that in the gird connection mode, so although a fault current can be detected in each of the island mode alone and the gird connection mode alone, if a switching operation is performed therebetween, there is a problem that the detection of a fault current may not be possible due to a difference in individual fault currents.

The present disclosure was made in view of such circumstances, and an object thereof is to provide a microgrid control system, a control method of a microgrid, and an intelligent electronic device that can detect a fault current by a protection relay even when a switching operation is performed between an island mode and a grid connection mode.

The present disclosure was made to obtain the above-described object, and an aspect of the present disclosure is a microgrid control system including: a first intelligent electronic device to detect an open/closed state of a switch coupling a microgrid and a higher-ordered system; a protection relay to disconnect a consumer from the microgrid when detecting a fault current; and a second intelligent electronic device including protection relay-controlling circuitry to apply, to the protection relay, a set value according to at least the open/closed state of the switch, wherein the protection relay detects the fault current using the set value applied by the second intelligent electronic device.

Another aspect of the present disclosure is that in the microgrid control system described above, the second intelligent electronic device includes a communicator to receive a notification indicating the open/closed state from the first intelligent electronic device.

Another aspect of the present disclosure is that in the microgrid control system described above, the set value applied to the protection relay when the open/closed state is in a closed state is greater than that when the open/closed state is in an open state.

Another aspect of the present disclosure is that in the microgrid control system described above, the set value applied to the protection relay is a value according to a magnitude of a power supply source in the microgrid when the open/closed state is in an open state.

Another aspect of the present disclosure is a control method of a microgrid including: detecting an open/closed state of a switch coupling the microgrid and a higher-ordered system; applying a set value according to at least the open/closed state to a protection relay in the microgrid; and disconnecting, by the protection relay, a consumer from the microgrid when the protection relay detects a fault current using the applied set value.

Another aspect of the present disclosure is an intelligent electronic device including: protection relay-controlling circuitry to control a protection relay in a microgrid and to apply, to the protection relay, a set value according to at least an open/closed state of a switch coupling the microgrid and a higher-ordered system.

According to the present disclosure, it is possible to detect a fault current by a protection relay even when a switching operation is performed between an island mode and a grid connection mode.

DETAILED DESCRIPTION OF THE INVENTION

Figure 1:
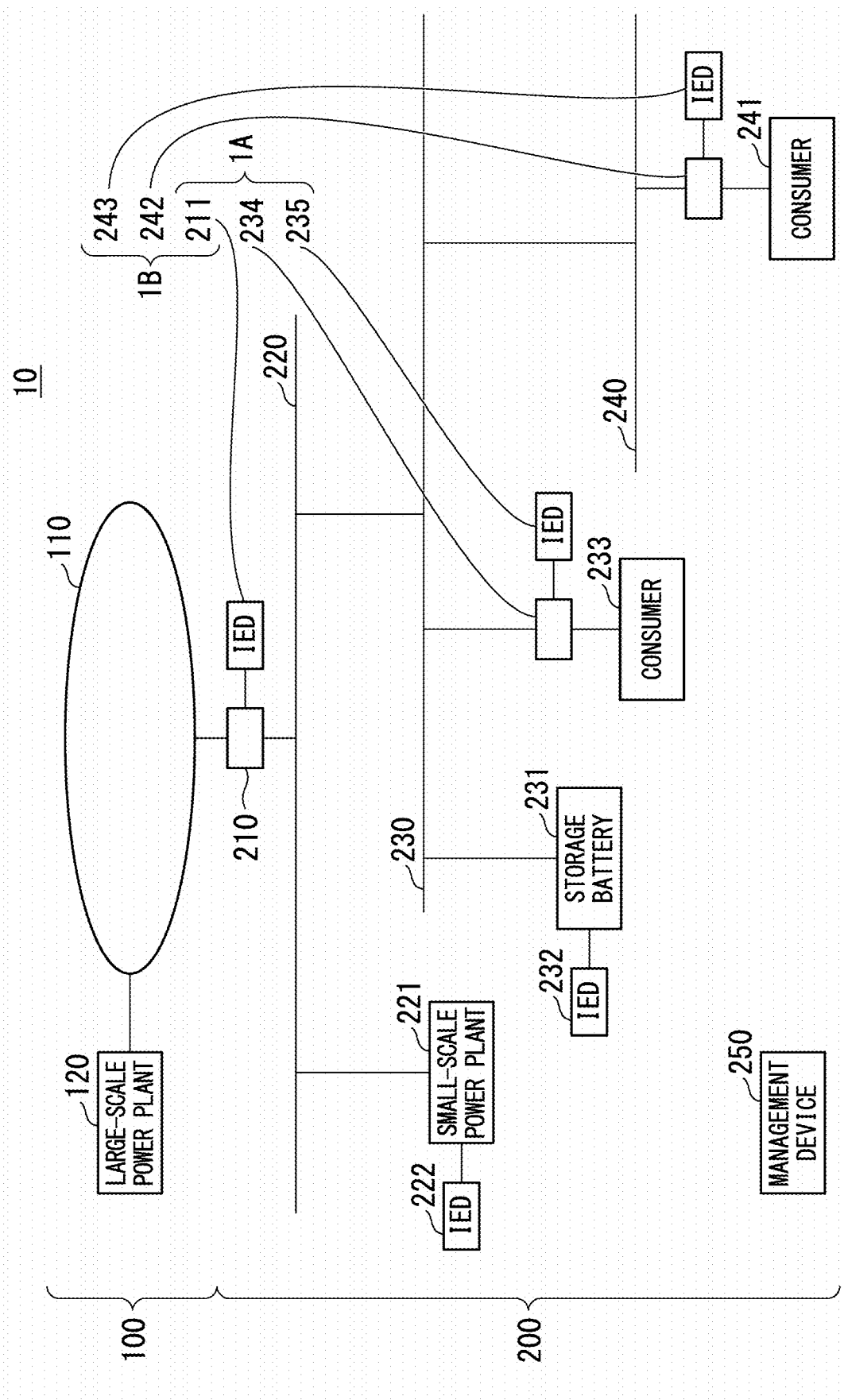
FIG. 1 is a schematic block diagram showing a configuration of a power transmission/distribution system 10 according to an embodiment of the present disclosure.

Hereinafter, embodiments of the present disclosure will be described with reference to the drawings. FIG. 1 is a schematic block diagram showing a configuration of a power transmission/distribution system 10 according to an embodiment. The power transmission/distribution system 10 includes a higher-ordered system 100 and a microgrid 200. The higher-ordered system 100 includes a power transmission system 110 and a large-scale power plant 120. The power transmission system 110 transmits, to the microgrid 200, electric power that the large-scale power plant 120 supplies. The large-scale power plant 120 is a power supply source that supplies electric power to the higher-ordered system 100 by using thermal power generation, hydroelectric power generation, nuclear power generation, or other power generation. Although FIG. 1 shows only one large-scale power plant 120 as a power supply source included in the higher-ordered system 100, the higher-ordered system 100 may include a plurality of power supply sources including small-scale sources.

The microgrid 200 includes a switch 210, an intelligent electronic device (hereinafter, referred to as "IED") 211 (first intelligent electronic device), a high-voltage system 220, a small-scale power plant 221, an IED 222, a low-voltage system 230, a storage battery 231, an IED 232, a consumer 233, a protection relay 234, an IED 235 (second intelligent electronic device), a distribution line 240, a consumer 241, a protection relay 242, an IED 243 (second intelligent electronic device), and a management device 250. The IEDs 211, 222, 232, 235 and 243 and the management device 250 are connected through a wired or wireless network (for example, an Ethernet (registered trademark)) (not shown) to be communicable and perform communication using, for example, a generic object oriented substation events (GOOSE) defined by an international electrotechnical commission (IEC) 61850. Each of the IEDs 211, 222, 232, 235 and 243 and the management device 250 is a structure that includes at least controlling circuitry or processing circuitry. In the embodiment, a microgrid control system 1A is configured of at least the IED 211, the IED 235, and the protection relay 234 among these, and another microgrid control system 1B is configured of at least the IED 211, the IED 243, and the protection relay 242.

The switch 210 is installed at a position (for example, a substation) at which the higher-ordered system 100 and the microgrid 200 are coupled. When the switch 210 is in a closed state, the higher-ordered system 100 and the microgrid 200 are connected together, and when the switch 210 is in an open state, the higher-ordered system 100 and the microgrid 200 are disconnected from each other. The IED 211 is installed in the vicinity of the switch 210 and is connected to the switch 210 in a wired manner. When the open/closed state of the switch 210 changes, the IED 211 notifies other IEDs, which include the IED 235 and the IED 243, and the management device 250 of the changed open/closed state. The IED 211 detects the open/closed state of the switch 210. At the time the switch 210 is in a closed state, the microgrid 200 is in the grid connection mode in which the microgrid 200 can receive electric power from the higher-ordered system 100. At the time the switch 210 is in an open state, the microgrid 200 is in the island mode in which the microgrid 200 does not receive electric power from the higher-ordered system 100. Therefore, the open/closed state of the switch 210 notified by the IED 211 also indicates whether the microgrid 200 is in the grid connection mode or the island mode.

The high-voltage system 220 is a power transmission system having the highest voltage in the microgrid 200 and is connected to the higher-ordered system 100 through the switch 210. The small-scale power plant 221 is a power supply source that supplies electric power to the microgrid 200 by using thermal power generation, hydroelectric power generation, solar power generation, wind power generation, or other power generation. The small-scale power plant 221 is connected to the high-voltage system 220. The IED 222 is installed in the vicinity of the small-scale power plant 221 and is connected to the small-scale power plant 221 in a wired manner. The IED 222 notifies other IEDs, which include the IED 235 and the IED 243, and the management device 250 whether or not the small-scale power plant 221 is supplying electric power.

The low-voltage system 230 is a power transmission/distribution system having a voltage lower than that of the high-voltage system 220 and is connected to the high-voltage system 220 through a substation facility (not shown). The storage battery 231 stores electric power from the microgrid 200 and supplies electric power to the microgrid 200. The storage battery 231 may be a secondary battery such as a lithium-ion battery or may be a facility that stores electric power by storing hydrogen generated by electrolyzing water. The IED 232 is installed in the vicinity of the storage battery 231 and is connected to the storage battery 231 in a wired manner. The IED 232 notifies other IEDs, which include the IED 235 and the IED 243, and the management device 250 whether or not the storage battery 231 is supplying electric power.

The consumer 233 is a consumer connected to the microgrid 200. The consumer is a person who needs electricity to be supplied and receives and uses the supplied electricity. The consumer 233 is a relatively large consumer who receives electric power from the microgrid 200 at the voltage of the low-voltage system 230. Therefore, the consumer 233 receives electric power at a higher voltage than the general consumer 241 that will be described later. The protection relay 234 is installed between the low-voltage system 230 and the consumer 233. When the protection relay 234 detects a current exceeding an applied set value, the detected current is regarded as a fault current, and the protection relay 234 disconnects the consumer 233 from the microgrid 200. The IED 235 is installed in the vicinity of the protection relay 234 and is connected to the protection relay 234 in a wired manner. The IED 235 controls the protection relay 234 of the consumer 233. For example, the IED 235 applies a set value to the protection relay 234 on the basis of a notification from another IED and notifies the management device 250 of the applied set value.

The distribution line 240 is a distribution line from the low-voltage system 230 to the general consumer 241. The distribution line 240 may include a pole transformer that steps down a voltage to the supply voltage for the consumer 241. The consumer 241 is a consumer connected to the microgrid 200. The protection relay 242 is installed between the distribution line 240 and the consumer 241. When the protection relay 242 detects a current exceeding an applied set value, the protection relay 242 disconnects the consumer 241 from the microgrid 200. The IED 243 is installed in the vicinity of the protection relay 242 and is connected to the protection relay 242 in a wired manner. The IED 243 controls the protection relay 242 of the consumer 241. For example, the IED 243 applies a set value to the protection relay 242 on the basis of a notification from another IED and notifies the management device 250 of the applied set value.

The management device 250 receives notifications from the IEDs 211, 222, 232, 235 and 243 and notifies an operator of the state of the microgrid 200 through display of a screen or the like. Examples of the state of the microgrid 200 of which the operator is notified include a determination concerning whether the microgrid 200 is in the island mode or the grid connection mode, a power supply status of each of the power supply sources (small-scale power plant 221 and storage battery 231), and set values applied to the protection relays 234 and 242. The management device 250 may be configured to inform the IEDs 235 and 243 of set values to be applied to the protection relays 234 and 242, respectively, in accordance with operator operations. The management device 250 may be configured to apply set value determination tables that will be described later to the IEDs 235 and 243 in accordance with operator operations.

Although the microgrid 200 includes the high-voltage system 220 and the low-voltage system 230 in FIG. 1, the present disclosure is not limited thereto. The microgrid 200 may include more than two systems or may include only one system. Although the microgrid 200 includes the small-scale power plant 221 and the storage battery 231 as power supply sources, the present disclosure is not limited thereto. The microgrid 200 may include more than two power supply sources or may include only one power supply source.

Notifications to other IEDs by the IEDs 211, 222 and 232 may be performed using any one of broadcast, multicast, and unicast protocols.

Figure 2:
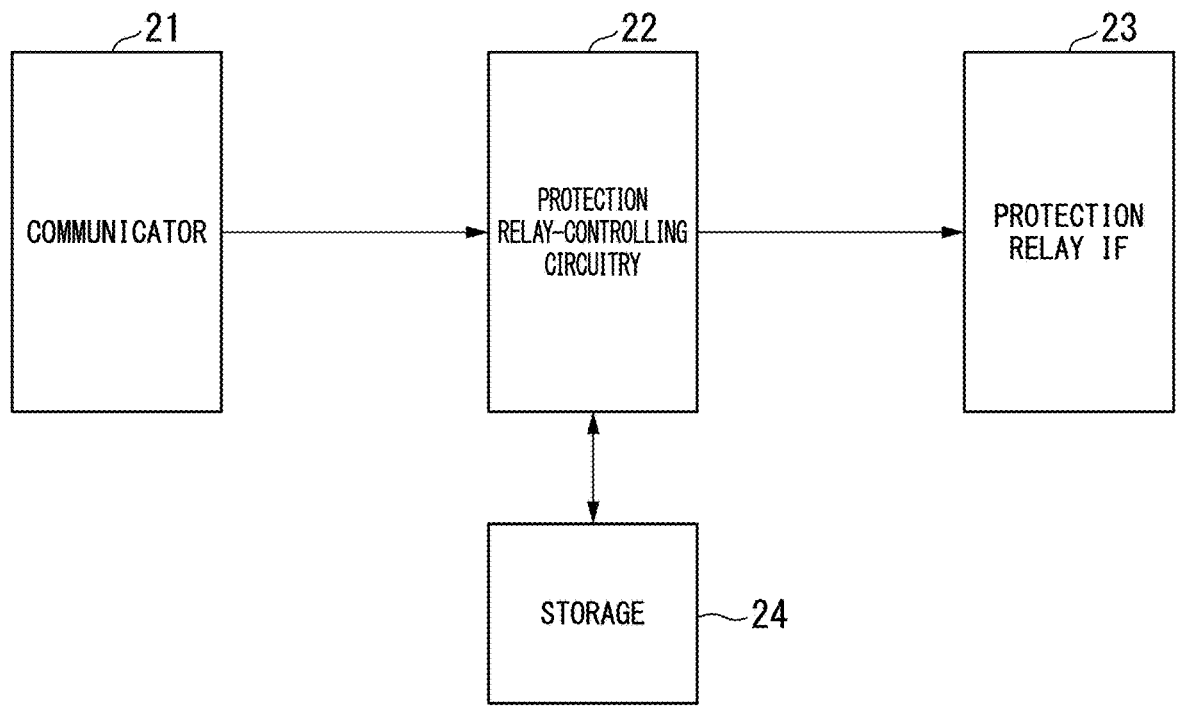
FIG. 2 is a schematic block diagram showing a configuration of an intelligent electronic device (hereinafter, referred to as "IED") 20 according to the embodiment.

FIG. 2 is a schematic block diagram showing a configuration of an IED 20 according to the embodiment. The IED 235 and the IED 243 have the same configuration as the IED 20. The IED 20 includes a communicator 21, protection relay-controlling circuitry 22, a protection relay interface (hereinafter, referred to as "IF") 23, and a storage 24. The communicator 21 communicates with other devices. For example, the communicator 21 receives a notification indicating the open/closed state of the switch 210 from the IED 211 that detects the open/closed state thereof. The communicator 21 notifies the management device 250 of the set value applied to the protection relay connected with the IED 20. The protection relay-controlling circuitry 22 controls the protection relay connected with the IED 20. The protection relay-controlling circuitry 22 determines a set value according to at least the open/closed state indicated by the above-described notification with reference to the set value determination table stored in the storage 24. The protection relay-controlling circuitry 22 applies the determined set value to the protection relay connected with the IED 20 through the protection relay IF 23. For example, when the switch 210 is in an open state, the protection relay-controlling circuitry 22 applies, to the protection relay, a set value less than that when the switch 210 is in a closed state. The storage 24 stores the set value determination table that will be described later. The protection relay IF 23 is a connection interface with the protection relay. The protection relay-controlling circuitry 22 of the IED 235 controls the protection relay 234, and the protection relay-controlling circuitry 22 of the IED 243 controls the protection relay 242. The protection relay IF 23 of the IED 235 is connected to the protection relay 234, and the protection relay IF 23 of the IED 243 is connected to the protection relay 242.

The protection relay-controlling circuitry 22 may determine a set value on the basis of the electric power supplied by the power supply source of the microgrid 200 when the switch 210 is in an open state. For example, the protection relay-controlling circuitry 22 may determine a set value to be applied to the protection relay using the set value determination table that stores a correspondence relationship between a set value and a combination of the open/closed state of the switch 210 and the electric power supplied by the power supply source of the microgrid 200. The set value determined by the protection relay-controlling circuitry 22 when the switch 210 is in an open state may be decreased value as the electric power supplied by the power supply source of the microgrid 200 decreases.

For example, the communicator 21 may receive, from the IED 222, a notification whether or not the small-scale power plant 221 is supplying electric power and receive, from the IED 232, a notification whether or not the storage battery 231 is supplying electric power, and the protection relay-controlling circuitry 22 may determine the electric power supplied by the power supply source of the microgrid 200 on the basis of these notifications. For example, the storage 24 may store in advance the electric power supplied by each of the power supply sources of the microgrid 200, and the protection relay-controlling circuitry 22 may add together the electric power supplied by power supply sources in which notifications indicating that these power supply sources are supplying electric power have been issued, among these, and may regard the added electric power as the total electric power supplied by the power supply sources of the microgrid 200.

For example, the communicator 21 receives, from the IED 222, a notification indicating the magnitude of the electric power supplied by the small-scale power plant 221 and receives, from the IED 232, a notification indicating the magnitude of the electric power supplied by the storage battery 231. If the storage battery 231 is in a state of storing electric power, the magnitude of the electric power supplied thereby may be shown as a negative value. The protection relay-controlling circuitry 22 may add together the magnitudes of the electric power indicated by these notifications and regard the obtained magnitude as the total magnitude of the electric power supplied by the power supply sources of the microgrid 200.

Figure 3:
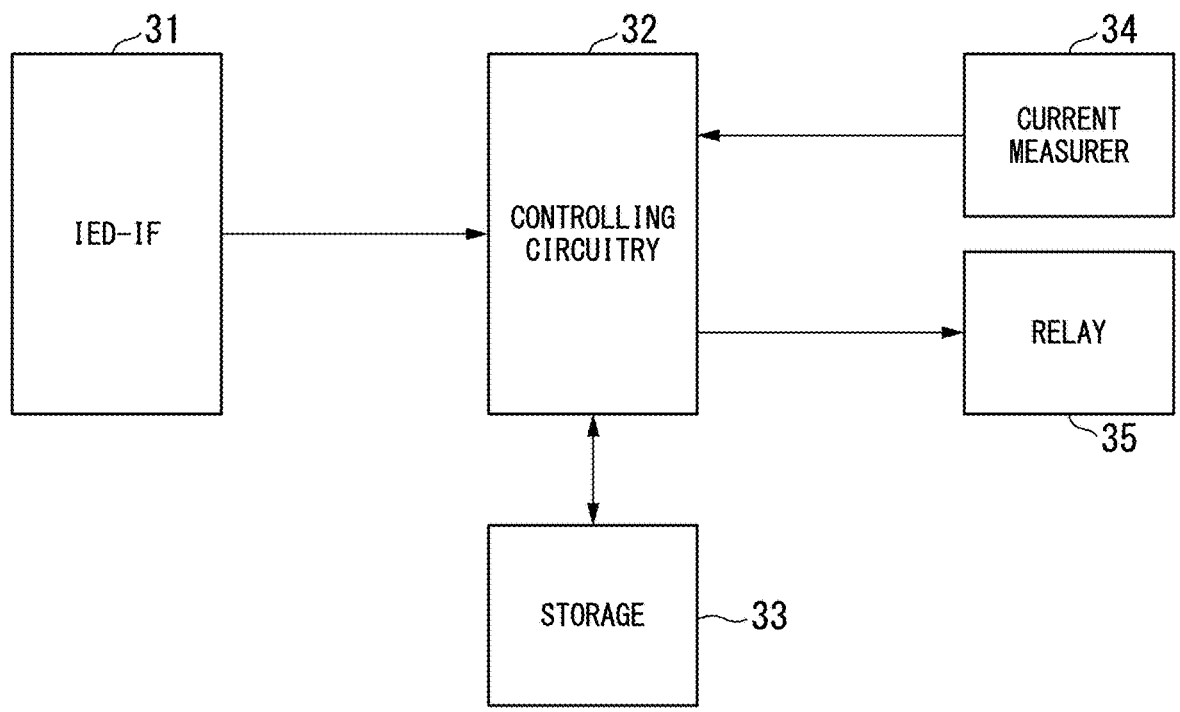
FIG. 3 is a schematic block diagram showing a configuration of a protection relay 30 according to the embodiment.

FIG. 3 is a schematic block diagram showing a configuration of a protection relay 30 according to the embodiment. The protection relay 234 and the protection relay 242 have the same configuration as the protection relay 30. The protection relay 30 includes an IED-IF 31, controlling circuitry 32, a storage 33, a current measurer 34, and a relay 35. The IED-IF 31 is a connection interface with the IED 235, the IED 243 and the like. For example, the applying of a set value to the protection relay 30 is performed through the IED-IF 31. The controlling circuitry 32 controls the operation of the protection relay 30. For example, the controlling circuitry 32 makes the storage 33 store the applied set value. When the current measured by the current measurer 34 exceeds the set value, the controlling circuitry 32 determines that a fault current is detected and turns off the relay 35. The current measurer 34 measures the current that is being supplied to the consumer. When the relay 35 is turned on, electric power is supplied from the microgrid 200 to the consumer therethrough, and when the relay 35 is turned off, the relay 35 disconnects the consumer from the microgrid 200.

Figures 4, 5, 6:
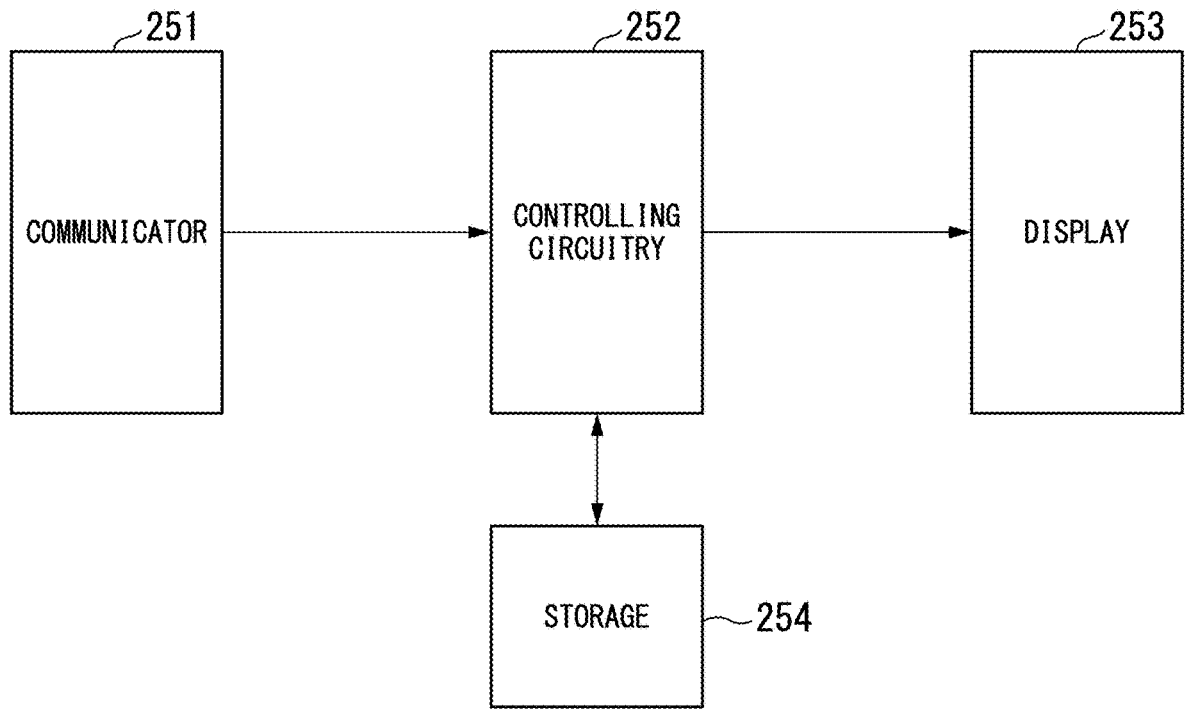
FIG. 4 is a schematic block diagram showing a configuration of a management device 250 according to the embodiment.
FIG. 5 is a table showing Content Example 1 of a set value determination table according to the embodiment.
FIG. 6 is a table showing Content Example 2 of the set value determination table according to the embodiment.

FIG. 4 is a schematic block diagram showing a configuration of the management device 250 according to the embodiment. The management device 250 includes a communicator 251, controlling circuitry 252, a display 253, and a storage 254. The communicator 251 communicates with the IEDs 211, 222, 232, 235 and 243. The controlling circuitry 252 receives notifications from the IEDs 211, 222, 232, 235 and 243 through the communicator 251 and generates a display image showing the state of the microgrid 200 on the basis of these notifications. The controlling circuitry 252 makes the storage 254 store the contents of the notifications from the IEDs 211, 222, 232, 235 and 243. The contents of the notifications are stored in the storage 254 in this way, whereby the controlling circuitry 252 can ascertain how the contents of the notifications change. The display 253 includes an image display device such as a liquid crystal display and an organic electro luminescence (EL) display and displays a display image generated by the controlling circuitry 252 on the screen.

FIG. 5 is a table showing Content Example 1 of the set value determination table according to the embodiment.

Content Example 1 is, for example, a content example of the set value determination table stored in the storage 24 of the IED 243. In Content Example 1, a set value "A1 [A]" is associated with a combination of the open/closed state "closed state" of the switch 210 and electric power "-" of the power supply source of the microgrid 200. The electric power "-" indicates that the set value does not depend on the magnitude of the electric power of the power supply source of the microgrid 200. This is because a fault current in the closed state, that is, in the grid connection mode is large so that an influence rate of the power supply source of the microgrid 200 on the fault current is small. The symbol [A] indicates that the unit is ampere. Similarly, in Content Example 1, a set value "A2 [A]" is associated with a combination of the open/closed state "open state" of the switch 210 and electric power "X1 [kW]" of the power supply source of the microgrid 200. The symbol [kW] indicates that the unit is kilowatts.

In Content Example 1, a set value "A3 [A]" is associated with a combination of the open/closed state "open state" of the switch 210 and electric power "X2 [kW]" of the power supply source of the microgrid 200, and a set value "A4 [A]" is associated with a combination of the open/closed state "open state" of the switch 210 and electric power "X3 [kW]" of the power supply source of the microgrid 200. X1>X2>X3 is satisfied and A1>A2>A3>A4 is satisfied. That is, the set value in the open state (island mode) is less than that in the closed state (grid connection mode). In the open state, the set value decreases as the electric power of the power supply source decreases. Thereby, even if the magnitude of the fault current differs depending on the operation state of the power supply source, it is possible to detect a fault current by the protection relays 234 and 242.

X1 may be set to the sum of the electric power supplied by the small-scale power plant 221 and the electric power supplied by the storage battery 231. If the electric power supplied by the small-scale power plant 221 is greater than the electric power supplied by the storage battery 231, X2 may be set to the electric power supplied by the small-scale power plant 221, and X3 may be set to the electric power supplied by the storage battery 231. On the other hand, the electric power supplied by the small-scale power plant 221 is less than the electric power supplied by the storage battery 231, X2 may be set to the electric power supplied by the storage battery 231, and X3 may be set to the electric power supplied by the small-scale power plant 221.

Although the set value determination table has specific numerical values as the magnitudes of the power supply source associated with the set values in FIG. 5, the table may have ranges of numerical values associated with the set values. For example, in the set value determination table, the set value "A2 [A]" may be associated with a combination of the open/closed state "open state" and the power supply source "X1 [kW] or more," the set value "A3 [A]" may be associated with a combination of the open/closed state "open state" and the power supply source "X2 [kW] or more and less than X1 [kW]," and the set value "A4 [A]" may be associated with a combination of the open/closed state "open state" and the power supply source "less than X2 [kW]." The same applies to FIG. 6 that will be described later.

Although the set value determination table has specific numerical values as the magnitudes of the power supply source associated with the set values in FIG. 5, the table may have combinations of power supply sources, which are supplying electric power, associated with the set values. For example, in the set value determination table, the set value "A2 [A]" may be associated with a combination of the open/closed state "open state" and the power supply source "small-scale power plant 221 and storage battery 231," the set value "A3 [A]" may be associated with a combination of the open/closed state "open state" and the power supply source "small-scale power plant 221," and the set value "A4 [A]" may be associated with a combination of the open/closed state "open state" and the power supply source "storage battery 231." The same applies to FIG. 6 that will be described later.

FIG. 6 is a table showing Content Example 2 of the set value determination table according to the embodiment. Content Example 2 is, for example, a content example of the set value determination table stored in the IED 235. That is, Content Example 2 is a content example of the set value determination table in a case in which the consumer 233 receives electric power at a voltage higher than that of Content Example 1. In Content Example 2, a set value "B1 [A]" is associated with a combination of the open/closed state "closed state" of the switch 210 and the electric power "-" of the power supply source of the microgrid 200. Similarly, a set value "B2 [A]" is associated with a combination of the open/closed state "open state" of the switch 210 and the electric power "X1 [kW]" of the power supply source of the microgrid 200, a set value "B3 [A]" is associated with a combination of the open/closed state "open state" of the switch 210 and the electric power "X2 [kW]" of the power supply source of the microgrid 200, and a set value "B4 [A]" is associated with a combination of the open/closed state "open state" of the switch 210 and the electric power "X3 [kW]" of the power supply source of the microgrid 200.

In Content Example 2, B1>B2>B3>B4 is satisfied. That is, the set value in the open state (island mode) is less than that in the closed state (grid connection mode). In the open state, the set value decreases as the electric power of the power supply source decreases. A1<B1, A2<B2, A3<B3, and A4<B4 are satisfied. That is, the set value further increases when the electric power is received at a higher voltage. Thereby, even if the magnitude of the fault current differs depending on the consumer, it is possible to detect a fault current by the protection relays 234 and 242.

Figure 7:
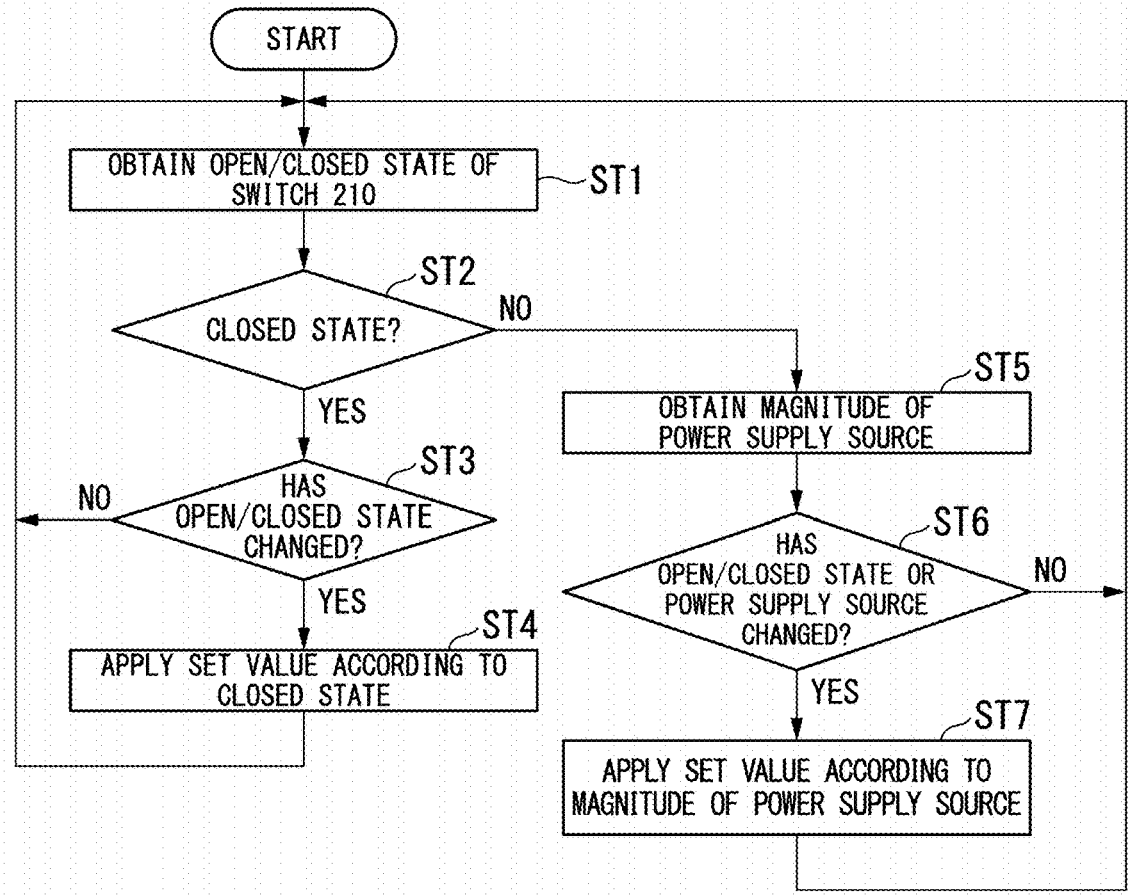
FIG. 7 is a flowchart showing operations of IEDs 235 and 243 according to the embodiment.

FIG. 7 is a flowchart showing the operation of the protection relay-controlling circuitry 22 according to the embodiment. Hereinafter, the protection relay-controlling circuitry 22 will be described as the protection relay-controlling circuitry 22 of the IED 243, which controls the protection relay 242. In a case of the protection relay-controlling circuitry 22 of the IED 235, which controls the protection relay 234, the protection relay 242 in the following description is read as the protection relay 234.

First, the protection relay-controlling circuitry 22 obtains the open/closed state of the switch 210 (Step ST1). The open/closed state is an open/closed state indicated by a notification, which has been transmitted by the IED 211 and has been received by the communicator 21. Subsequently, the protection relay-controlling circuitry 22 determines whether or not the obtained open/closed state indicates a closed state (Step ST2). When it is determined that the open/closed state indicates the closed state (Step ST2—Yes), the protection relay-controlling circuitry 22 determines whether or not the open/closed state has changed (Step ST3). For example, the protection relay-controlling circuitry 22 may make the storage 24 store the previously obtained open/closed state and may compare the stored previously obtained open/closed state with the open/closed state obtained at this time, thereby determining whether or not the open/closed state has changed.

When it is determined that the open/closed state has changed (Step ST3—Yes), the protection relay-controlling circuitry 22 applies the set value in the closed state to the protection relay 242 through the protection relay IF 23 with reference to the set value determination table (Step ST4), and the process of the protection relay-controlling circuitry 22 returns to Step ST1. When it is determined in Step ST3 that the open/closed state has not changed (Step ST3—No), the process of the protection relay-controlling circuitry 22 returns to Step ST1 without doing anything.

When it is determined in Step ST2 that the open/closed state does not indicate the closed state (indicates the open state) (Step ST2—No), the protection relay-controlling circuitry 22 obtains the magnitude of the power supply source of the microgrid 200 (Step ST5). The magnitude of the power supply source is a value calculated by the protection relay-controlling circuitry 22 on the basis of notifications, which has been transmitted by the IED 222 and the IED 232 and has been received by the communicator 21.

For example, when a notification transmitted by the IED 222 indicates that the small-scale power plant 221 is supplying electric power and a notification transmitted by the IED 232 also indicates that the storage battery 231 is supplying electric power, the protection relay-controlling circuitry 22 regards the sum of the electric power of the small-scale power plant 221 and the electric power of the storage battery 231 as the magnitude of the power supply source. When a notification transmitted by the IED 222 indicates that the small-scale power plant 221 is supplying electric power and a notification transmitted by the IED 232 indicates that the storage battery 231 is not supplying electric power, the protection relay-controlling circuitry 22 regards the electric power of the small-scale power plant 221 as the magnitude of the power supply source. When notifications transmitted by the IED 222 and the IED 232 indicate the electric power supplied by the small-scale power plant 221 and the electric power supplied by the storage battery 231, respectively, the protection relay-controlling circuitry 22 may regard the total electric power indicated by these notifications as the magnitude of the power supply source.

Subsequently, the protection relay-controlling circuitry 22 determines whether or not the open/closed state or the magnitude of the power supply source has changed (Step ST6). With regard to the open/closed state, for example, the protection relay-controlling circuitry 22 may store the previously obtained open/closed state in the storage 24 and may compare the stored previously obtained open/closed state with the open/closed state obtained at this time, thereby determining whether or not the open/closed state has changed. With regard to the magnitude of the power supply source, for example, the protection relay-controlling circuitry 22 may store the previously obtained magnitude of the power supply source in the storage 24 and may compare the stored previously obtained magnitude of the power supply source with the magnitude of the power supply source obtained at this time, thereby determining whether or not the magnitude of the power supply source has changed.

When it is determined that either the open/closed state or the magnitude of the power supply source has changed (Step ST6—Yes), the protection relay-controlling circuitry 22 applies the set value according to the magnitude of the power supply source with reference to the set value determination table to the protection relay 242 through the protection relay IF 23 (Step ST7), and the process of the protection relay-controlling circuitry 22 returns to Step ST1. When it is determined in Step ST6 that neither the open/closed state nor the magnitude of the power supply source has changed (Step ST6—No), the process of the protection relay-controlling circuitry 22 also returns to Step ST1.

Figure 8:
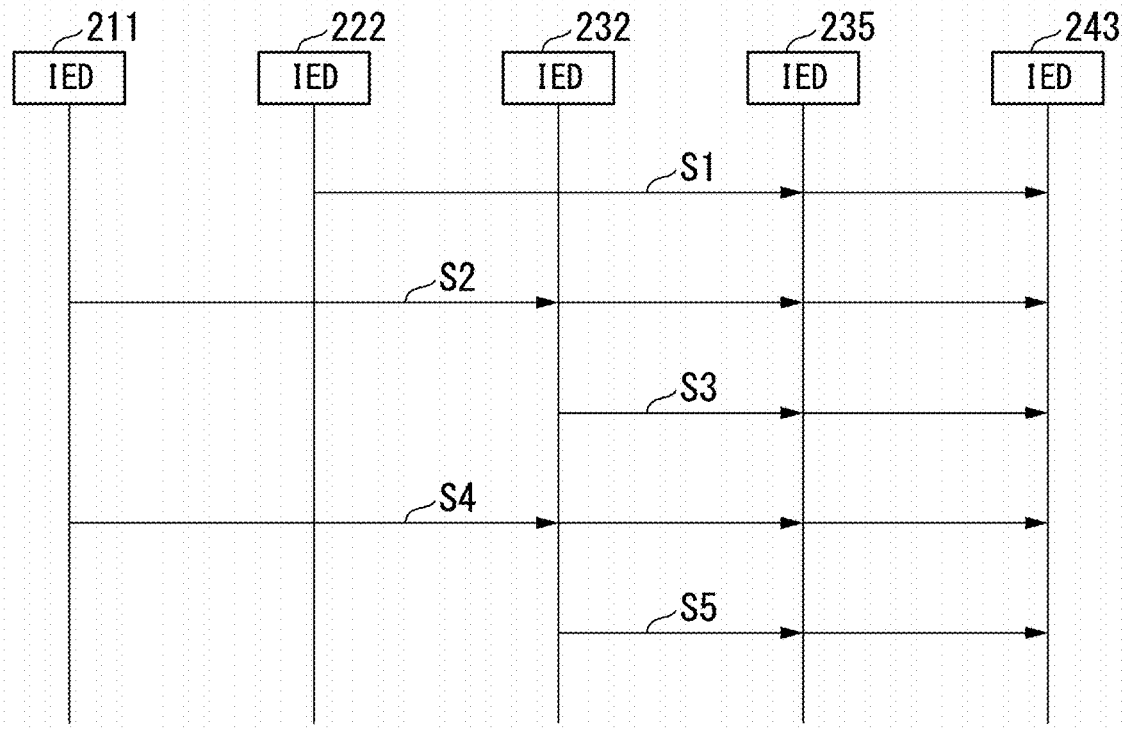
FIG. 8 is a sequence diagram showing an operation of a microgrid 200 according to the embodiment.

FIG. 8 is a sequence diagram showing the operation of the microgrid 200 according to the embodiment. When the sequence shown in FIG. 8 starts, it is assumed that the switch 210 is in a closed state and the small-scale power plant 221 and the storage battery 231 are not suppling electric power. When the small-scale power plant 221 is in operation and starts supplying electric power, the IED 222 issues a notification that the small-scale power plant 221 is supplying electric power (Sequence S1). This notification is received by the IED 235 that controls the protection relay 234 and the IED 243 that controls the protection relay 242. Since the switch 210 is in the closed state and the mode is in the grid connection mode, the IED 235 and the IED 243 do not change the set values for the protection relay 234 and the protection relay 242, respectively.

Subsequently, when the switch 210 changes to the open state for some reason, the IED 211 issues a notification that the switch 210 is in the open state (Sequence S2). This notification is received by the IED 232 of the storage battery 231, the IED 235 that controls the protection relay 234, and the IED 243 that controls the protection relay 242. Since the switch 210 changes to the open state and the mode is in the island mode, the IED 235 and the IED 243 apply the set values according to the power supply source of the microgrid 200 to the protection relay 234 and the protection relay 242, respectively. At this time, only the small-scale power plant 221 is supplying electric power, so the IED 235 and the IED 243 apply the set values according to the electric power of the small-scale power plant 221 to the protection relay 234 and the protection relay 242, respectively.

The IED 232 receives the notification of Sequence S2 and controls the storage battery 231 to start supplying electric power. The IED 232 issues a notification that the storage battery 231 is supplying electric power (Sequence S3). This notification is received by the IED 235 that controls the protection relay 234 and the IED 243 that controls the protection relay 242. Thereby, although the mode has not changed from the island mode, both of the small-scale power plant 221 and the storage battery 231 are set to supply electric power, so the IED 235 and the IED 243 apply the set values according to the total electric power of the small-scale power plant 221 and the storage battery 231 to the protection relay 234 and the protection relay 242, respectively.

Subsequently, when the switch 210 returns to the closed state, the IED 211 issues a notification that the switch 210 is in the closed state (Sequence S4). This notification is received by the IED 232 of the storage battery 231, the IED 235 that controls the protection relay 234, and the IED 243 that controls the protection relay 242. Since the switch 210 changes to the closed state and the mode is in the grid connection mode, the IED 235 and the IED 243 apply the set values according to the closed state to the protection relay 234 and the protection relay 242, respectively.

The IED 232 receives the notification of Sequence S4 and controls the storage battery 231 to stop supplying electric power. The IED 232 issues a notification that the storage battery 231 stops supplying electric power (Sequence S5). This notification is received by the IED 235 that controls the protection relay 234 and the IED 243 that controls the protection relay 242. Thereby, although the magnitude of the power supply source changes, the open/closed state is maintained to the closed state, so the IED 235 and the IED 243 do not change the set values.

Figure 9:
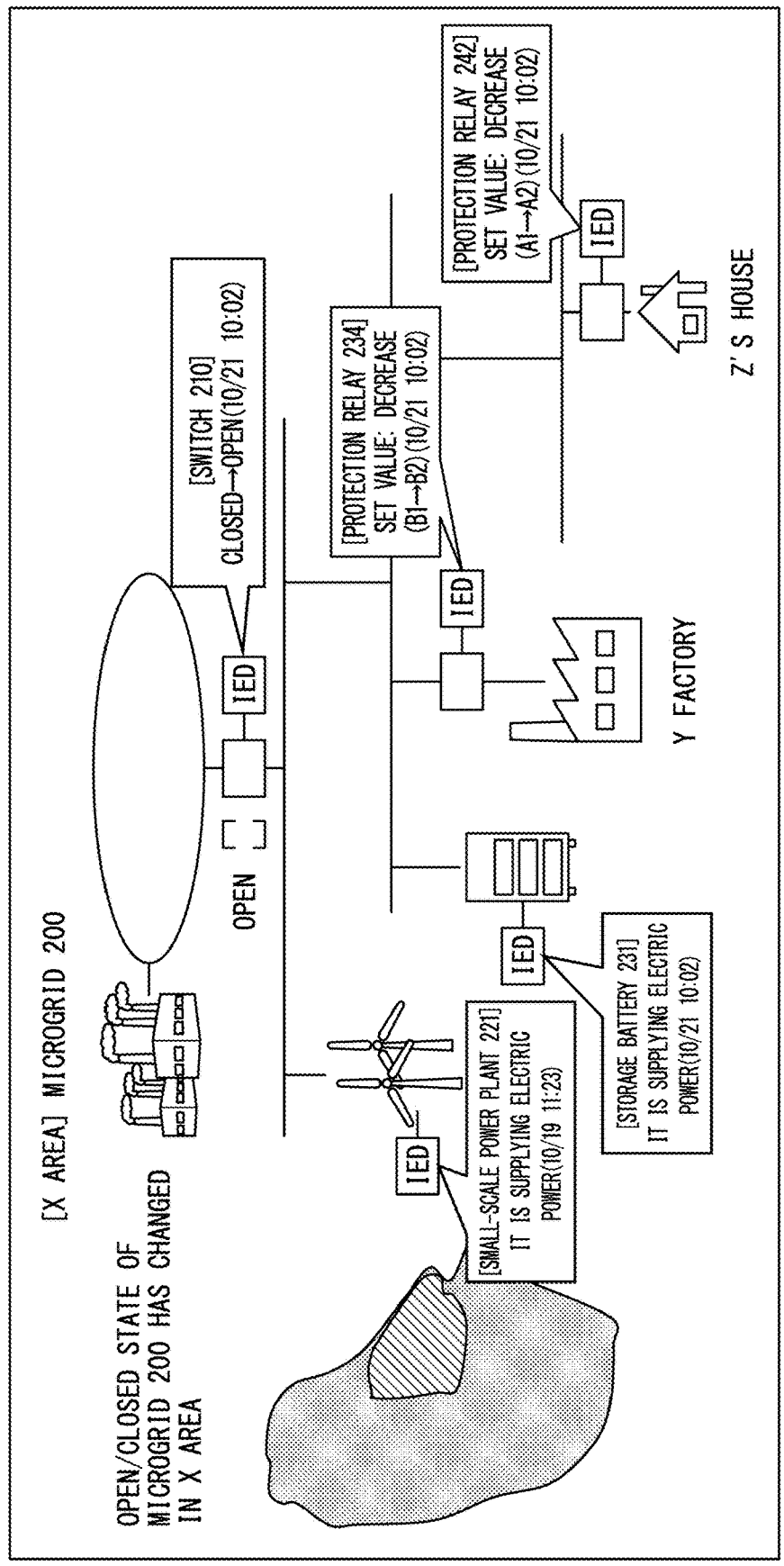
FIG. 9 is a schematic diagram showing an example of a display screen of the management device 250 according to the embodiment.

FIG. 9 is a schematic diagram showing an example of a display screen of the management device 250 according to the embodiment. The example of the display screen of FIG. 9 is an example of the display screen in which the open/closed state of the switch 210 changes from the closed state to the open state at 10:02 on October 21. The management device 250 receives, from the IED 211, a notification indicating that the switch 210 is in the open state and displays "[switch 210] closed→open (10/21 10:02)" near the icon of the IED 211. The date and time in parentheses are the date and time when this notification has been received or the date and time when the notification has been issued.

The management device 250 displays information regarding the switch 210 whose open/closed state has been changed in the notification, the microgrid 200 coupled to the switch 210, and the higher-ordered system 100. The management device 250 displays an area in which the microgrid 200 is installed on a map. The management device 250 receives, from the IED 235, a notification indicating that the set value is set to B2 and displays "[protection relay 234] set value: decrease (B1→B2) (10/21 10:02)" near the icon of the IED 235. Similarly, the management device 250 receives, from the IED 243, a notification indicating that the set value is set to A2 and displays "[protection relay 242] set value: decrease (A1→A2) (10/21 10:02)" near the icon of the IED 243.

The management device 250 receives a notification indicating that the small-scale power plant 221 is supplying electric power from the IED 222 at 11:23 on October 19 and displays "[small-scale power plant 221] it is supplying electric power (10/19 11:23)" near the icon of the IED 222. Similarly, the management device 250 receives a notification indicating that the storage battery 231 is supplying electric power from the IED 232 at 10:02 on October 21 and displays "[storage battery 231] it is supplying electric power (10/21 10:02)" near the icon of the IED 232. When the displaying is performed in this way, an operator can easily ascertain the situations of the microgrid 200, the protection relays 234 and 242.

Although the set value is associated with the combination of the open/closed state and the power supply source in the set value determination table of the above-described embodiment, the set value may be associated with the open/closed state. For example, the association of the set value with the open/closed state is suitable when the magnitude of the power supply source does not change or is small in the island mode such as when the microgrid 200 has only one power supply source.

The microgrid control system of the above-described embodiment includes the IED 211 that detects the open/closed state of the switch coupling the microgrid 200 and the higher-ordered system 100, and the IED 235 or the IED 243 that controls the protection relay 234 or the protection relay 242 in the microgrid 200, and the IED 235 or the IED 243 includes the communicator 21 that receives a notification indicating the open/closed state from the IED 211, and the protection relay-controlling circuitry 22 that applies a set value according to at least the open/closed state indicated by the notification to the protection relay 234 or the protection relay 242. Thereby, the set value according to whether or not the microgrid is connected to the higher-ordered system is applied to the protection relay 234 or the protection relay 242. Therefore, even when the mode is in the island mode, the protection relay 234 or the protection relay 242 can detect a fault current. Since the IEDs 235 and 243 autonomously set the set values, it is possible to easily add similar IEDs to the microgrid control system.

A program for realizing the function of the IED 20 shown in FIG. 2 may be recorded on a non-transitory computer-readable recording medium, and the program recorded on the recording medium may be read into a computer system and be executed to realize the function of the IED 20. The "computer system" described herein includes an OS and hardware such as peripheral devices.

The "non-transitory computer-readable recording medium" refers to a portable medium such as a flexible disk, a magneto-optical disk, a ROM, a CD-ROM, or a DVD, or a storage device such as a hard disk or an SSD built in a computer system. The "non-transitory computer-readable recording medium" includes a medium that holds a program for a certain period of time such as a volatile memory inside a computer system. The above program may be for realizing part of the above-described functions and may be for realizing the above-described functions in combination with a program recorded in the computer system in advance.

Each functional block of the IED 20 shown in FIG. 2 described above may be individually realized as a chip or part or all of them may be integrated into a chip. A method for making an integrated circuit is not limited to an LSI and may be realized by a dedicated circuit or a general-purpose processor. Either hybrid or monolithic may be used. Some of the functions may be realized by hardware and some of the functions may be realized by software.

When technologies such as integrated circuits that replace LSIs emerge due to advances in semiconductor technology, it is possible to use integrated circuits based on these technologies for the IEDs of the present disclosure.

Each of the controlling circuitry and the processing circuitry described in the above embodiment may include a memory storing instructions for realizing the above-described functions of respective circuitry, and a processor that executes the instructions. The storage described in the above embodiment includes a HDD, an SSD, a RAM, and a non-volatile memory such as a flash memory.

Hereinbefore, the embodiment of the present disclosure has been described in detail with reference to the drawings, but the specific configuration is not limited to this embodiment and includes design changes and the like within the scope of the present disclosure.

What is claimed is:

1. A microgrid control system, comprising:
   a first intelligent electronic device to detect an open/closed state of a switch coupling a power transmission system included in a microgrid and a higher-ordered system;
   a protection relay installed between the power transmission system of the microgrid and a consumer receiving electricity supplied from the power transmission system of the microgrid and to disconnect the consumer from the power transmission system of the microgrid when detecting a fault current; and
   a second intelligent electronic device including:
   protection relay-controlling circuitry to apply, to the protection relay, a set value according to at least the open/closed state of the switch, and
   a storage that stores a correspondence relationship in which, in the open/closed state being an open state, the set value decreases as the electric power of a power supply source in the microgrid decreases, and the set value to be applied to the protection relay further increases when the consumer receives the electric power from the power supply source at a higher voltage, wherein the protection relay detects the fault current using the set value applied by the second intelligent electronic device.

2. The microgrid control system according to claim 1, wherein the second intelligent electronic device includes a communicator to receive a notification indicating the open/closed state from the first intelligent electronic device.

3. The microgrid control system according to claim 2, wherein the set value applied to the protection relay when the open/closed state is in a closed state is greater than that when the open/closed state is in an open state.

4. The microgrid control system according to claim 2, wherein the set value applied to the protection relay is a value according to a magnitude of a power supply source in the microgrid when the open/closed state is in an open state.

5. The microgrid control system according to claim 3, wherein the set value applied to the protection relay is a value according to a magnitude of a power supply source in the microgrid when the open/closed state is in an open state.

6. The microgrid control system according to claim 1, wherein the set value applied to the protection relay when the open/closed state is in a closed state is greater than that when the open/closed state is in an open state.

7. The microgrid control system according to claim 6, wherein the set value applied to the protection relay is a value according to a magnitude of a power supply source in the microgrid when the open/closed state is in an open state.

8. The microgrid control system according to claim 1, wherein the set value applied to the protection relay is a value according to a magnitude of a power supply source in the microgrid when the open/closed state is in an open state.

9. The microgrid control system according to claim 1, wherein the correspondence relationship is a relationship between the set value to be applied to the protection relay and a combination of the open/closed state and the electric power supplied by the power supply source in the microgrid.

10. The microgrid control system according to claim 1, further comprising:
a management device displaying a change in the open/closed state of the switch, a change in the set value applied to the protection relay by the second intelligent electronic device, and a state of electric power supply of the power supply source in the microgrid.

11. A control method of a microgrid, comprising:
detecting, by a first intelligent electronic device, an open/closed state of a switch coupling a power transmission system included in the microgrid and a higher-ordered system;
applying, by a second intelligent electronic device, a set value according to at least the open/closed state to a protection relay installed between the power transmission system of the microgrid and a consumer receiving electricity supplied from the power transmission system of the microgrid, the protection relay being configured to disconnect the consumer from the power transmission system of the microgrid;
storing, by the second intelligent electronic device, a correspondence relationship in which, when the open/closed state is an open state, the set value decreases as the electric power of a power supply source in the microgrid decreases, and the set value to be applied to the protection relay further increases when the consumer receives the electric power from the power supply source at a higher voltage,
detecting a fault current by the protection relay using the applied set value; and
disconnecting, by the protection relay, the consumer from the power transmission system of the microgrid based on the detected fault current.

12. The control method of a microgrid according to claim 11, wherein the set value is applied by the second intelligent electronic device according to at least the open/closed state and the correspondence relationship, stored in the second intelligent electronic device, between the set value and a combination of the open/closed state and the electric power supplied by the power supply source in the microgrid.

13. An intelligent electronic device, comprising:
protection relay-controlling circuitry to control a protection relay installed between a power transmission system included in a microgrid and a consumer receiving electricity supplied from the power transmission system of the microgrid, and to apply, to the protection relay, a set value according to at least an open/closed state of a switch coupling the power transmission system of the microgrid and a higher-ordered system, the protection relay being configured to disconnect the consumer from the power transmission system of the microgrid, and the open/closed state being detected by another intelligent electronic device,
a storage that stores a correspondence relationship in which, when the open/closed state is an open state, the set value decreases as electric power from a power supply source of the microgrid decreases, and the set value to be applied to the protection relay further increases when the consumer receives the electric power from the power supply source at a higher voltage.

14. The intelligent electronic device according to claim 13, further comprising:
the correspondence relationship is a relationship between the set value to be applied to the protection relay and a combination of the open/closed state and the electric power supplied by the power supply source in the microgrid.

15. A control method of a microgrid, comprising:
detecting, by a first intelligent electronic device, an open/closed state of a switch coupling a power transmission system included in the microgrid and a higher-ordered system;
applying, by a second intelligent electronic device, a set value according to at least the open/closed state to a protection relay installed between the power transmission system of the microgrid and a consumer receiving electricity supplied from the power transmission system of the microgrid, the protection relay being configured to disconnect the consumer from the power transmission system of the microgrid, wherein the set value is applied by the second intelligent electronic device according to at least the open/closed state and a correspondence relationship, the correspondence relationship is stored in the second intelligent electronic device and is in which, in the open/closed state being an open state, the set value decreases as the electric power of a power supply source in the microgrid decreases, and the set value to be applied to the protection relay further increases when the consumer receives the electric power from the power supply source at a higher voltage,
detecting a fault current by the protection relay using the applied set value; and disconnecting, by the protection relay, the consumer from the power transmission system of the microgrid based on the detected fault current.

\* \* \* \* \*